United States Patent
Lee et al.

(10) Patent No.: US 8,512,503 B2
(45) Date of Patent: Aug. 20, 2013

(54) METHOD OF MANUFACTURING SEALING DEVICE AND DISPLAY DEVICE USING THE SAME

(71) Applicant: Samsung Display Co., Ltd., Yongin (KR)

(72) Inventors: Jong-woo Lee, Yongin (KR); Tae-seung Kim, Yongin (KR); Joon-young Park, Yongin (KR); Won-kyu Kwak, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/764,519

(22) Filed: Feb. 11, 2013

(65) Prior Publication Data
US 2013/0153141 A1     Jun. 20, 2013

Related U.S. Application Data

(62) Division of application No. 11/724,854, filed on Mar. 16, 2007, now Pat. No. 8,371,353.

(30) Foreign Application Priority Data

Nov. 9, 2006 (KR) .................. 10-2006-0110572

(51) Int. Cl.
*B29C 65/14* (2006.01)
(52) U.S. Cl.
USPC ...................................................... 156/275.3
(58) Field of Classification Search
USPC ............... 156/272.2, 272.8, 275.3, 275.1
See application file for complete search history.

(56) References Cited

U.S. PATENT DOCUMENTS

| | | | |
|---|---|---|---|
| 5,843,265 | A | 12/1998 | Grimm |
| 5,985,069 | A | 11/1999 | Kawabe et al. |
| 6,517,403 | B1 | 2/2003 | Cooper et al. |

(Continued)

FOREIGN PATENT DOCUMENTS

| | | |
|---|---|---|
| DE | 20 2006 008 749 U1 | 9/2006 |
| EP | 0997261 B1 | 5/2000 |

(Continued)

OTHER PUBLICATIONS

Office Action issued Jan. 4, 2012, claiming priority to the corresponding Korean Patent Application No. 10-2006-0110572.

(Continued)

*Primary Examiner* — Daniel McNally
(74) *Attorney, Agent, or Firm* — Knobbe Martens Olson & Bear LLP

(57) ABSTRACT

A sealing device including a mask for partially irradiating light and a method of manufacturing a display device using the sealing device is disclosed. The sealing device used to bond first and second substrates by interposing a sealing material at edges of the first and second substrates and by irradiating light to the sealing material comprises: a mask disposed on one side of the stage, in which a transmission portion is formed in correspondence to the formation position of the sealing member so that light can be irradiated to the sealing material; and an optical head irradiating the light to the sealing material through the transmission portion of the mask. A pattern for regulating the amount of the light irradiated to the sealing material is formed in the transmission portion of the mask.

7 Claims, 6 Drawing Sheets

(56) References Cited

U.S. PATENT DOCUMENTS

| | | |
|---|---|---|
| 2004/0027066 A1 | 2/2004 | Park et al. |
| 2004/0030384 A1 | 2/2004 | Wissman |
| 2005/0100703 A1* | 5/2005 | Terada et al. ............... 428/57 |
| 2006/0082298 A1* | 4/2006 | Becken et al. ............. 313/512 |
| 2008/0182062 A1 | 7/2008 | Becken et al. |

FOREIGN PATENT DOCUMENTS

| | | |
|---|---|---|
| JP | 2004-185827 A | 7/2004 |
| JP | 2005-001216 A | 1/2005 |
| JP | 2008-517446 A | 5/2008 |
| KR | 10-2001-0084380 A | 9/2001 |
| KR | 10-2002-0051153 A | 6/2002 |
| KR | 10-2004-0011954 A | 2/2004 |
| TW | 493358 B | 7/2002 |
| TW | 561638 B | 11/2003 |
| TW | I229946 B | 3/2005 |
| TW | I248773 B | 2/2006 |
| WO | WO 00/34008 A1 | 6/2000 |
| WO | WO 2006/082298 A1 | 8/2006 |

OTHER PUBLICATIONS

Japanese Office Action for Japanese Patent Application No. 2006-325767, which claims priority to corresponding Korean Patent Application 10-2006-0110572, dated Dec. 7, 2010, 3 pages.

Japanese Office Action for Japanese Patent Application No. 2006-325767, Samsung Mobile Display Co., Ltd., 3 pages, dated Jul. 6, 2010.

Extended European Search Report issued on Jun. 26, 2008 in corresponding European Patent Application No. 07120244.4 in 9 pages.

Japanese Office Action for Application No. 2006-325787; dated Dec. 18, 2009, 2 pages.

Notice of Allowance issued on Jun. 27, 2008 in corresponding Korean Patent Application No. 10-2006-0110572 in 2 pages.

* cited by examiner

METHOD OF MANUFACTURING SEALING DEVICE AND DISPLAY DEVICE USING THE SAME

CROSS-REFERENCE TO RELATED APPLICATIONS

This application is a divisional of and claims priority to U.S. patent application Ser. No. 11/724,854, filed Mar. 16, 2007 (which will issue as U.S. Pat. No. 8,371,353) which claims the benefit of Korean Patent Application No. 10-2006-0110572, filed Nov. 9, 2006, in the Korean Intellectual Property Office, both of which are incorporated herein by reference in their entirety.

BACKGROUND

1. Field of Technology

The present invention relates to a sealing device and a method of manufacturing a display device using the sealing device, and more particularly to a sealing device including a mask for partially irradiating light and a method of manufacturing a display device using the sealing device.

2. Discussion of Related Technology

Generally, an organic light display device includes a substrate provided a pixel region and a non-pixel region, and a container or a substrate disposed opposite to the substrate for encapsulation and adhered to the substrate by a sealant such as epoxy.

A plurality of light emitting devices connected between a scan line and a date line in the form of matrix are formed in the pixel region of the substrate, and the light emitting device includes an anode electrode and a cathode electrode, and an organic thin film layer formed between the anode electrode and the cathode electrode and having a hole transportation layer, an organic light emitting layer, and an electron transportation layer.

However, the light emitting device is vulnerable to hydrogen and oxygen since it contains an organic material and is easily oxidized by moisture in air so that the electrical and light emitting characteristic thereof are deteriorated since the cathode electrode is formed of a metal material. In order to prevent this problem, moisture penetrating from outside is removed by mounting a moisture absorbing material to a container in the form of a can or a cup of a metal material or a substrate of glass or plastic in the form of powder or by bonding the container or the substrate in the form of a film.

However, the method of mounting the moisture absorbing material in the form of powder complicates the process and increases the material and process costs, thereby increasing the thickness of the display device. So, it is difficult to apply the method to entire surface light emission. Further, the method of bonding a moisture absorbing material in the form of a film can limitedly remove moisture and has low durability and reliability, thereby making mass-production difficult.

In order to solve the above-mentioned problem, a method using a sealing material such as a frit and bonding the sealing material by irradiating laser has been used.

Korean Patent Laid-Open No. 2001-0084380 (Sep. 6, 2001) discloses a method for sealing a fit frame using laser.

Korean Patent Laid-Open No. 2002-0051153 (Jun. 28, 2002) discloses a packaging method for attaching an upper substrate and a lower substrate to a frit layer using laser.

SUMMARY OF CERTAIN INVENTIVE ASPECTS

Accordingly, certain inventive aspects provide a sealing device capable of uniformly bonding a sealing material and a substrate.

One inventive aspect is a method of manufacturing a display device using a sealing device capable of improving the sealing effect and the reliability by uniformly bonding a sealing material and a substrate.

According to another aspect, a sealing device used to bond a first substrate and a second substrate by interposing a sealing material at edges of the first substrate and the second substrate opposite to each other and by irradiating light to the sealing material comprises: a stage to which the first substrate and the second substrate between which the sealing material is interposed is mounted; a mask disposed on one side of the stage, in which a transmission portion is formed in correspondence to the formation position of the sealing member so that light can be irradiated to the sealing material; and an optical head irradiating the light to the sealing material through the transmission portion of the mask. In the sealing device, a pattern for regulating the amount of the light irradiated to the sealing material is formed in the transmission portion of the mask.

Another aspect is a method of manufacturing a display device comprises the steps of: mounting a first substrate and a second substrate to a stage by disposing the first substrate and the second substrate so as to be opposite to each other, with a sealing material being located between the first substrate and the second substrate; locating a mask in which a transmission portion is formed at a portion corresponding to the position of the formed sealing material and a predetermined pattern is formed at the transmission portion; and bonding the sealing material to the first substrate by irradiating light to the transmission portion. In the method, the amount of the irradiated light is regulated by the pattern formed in the transmission portion.

One aspect of the invention is a sealing device for bonding a first substrate and a second substrate by interposing a sealing material along edges of the first substrate and the second substrate and by irradiating light to the sealing material.

The sealing device comprises: a mask, disposed on the second substrate stacked on the first substrate, comprising a transmission portion formed in correspondence to the sealing material; and an optical head irradiating the light to the sealing material through the transmission portion of the mask. The transmission portion of the mask comprises a plurality of patterns for regulating the light irradiated to the sealing material.

The transmission portion of the mask can comprise a plurality of regions having patterns with different transmittances. The plurality of patterns can be aligned with at least of a part of the sealing material. The energy distribution of the light across the sealing material can be controlled by the plurality of patterns.

The transmission portion can comprise a first region at a central portion thereof and a second region on both sides of the first region, and the transmittances of the patterns in the first region and the second region can be different. The transmittance of the pattern in the first region can be lower than that of the second region. The pattern can comprise a plurality of opaque lines, and the transmittance can be controlled by density of the opaque lines of the patterns.

The transmission portion can comprise a first region on one side and a second region on the other side and the transmittances of the patterns of the first region and the second region are different.

The transmission portion can comprise a first region at a central portion, a second region provided on both sides of the first region, and a third region provided on both outer sides of the second region, and the transmittances of the patterns of the first region, the second region, and the third region can be different. The first, second, and third regions can comprise line-shaped patterns comprising a plurality of opaque lines, and the transmittance can be controlled by density of the opaque lines of the patterns.

The light can comprise one of laser and infrared.

The device can further comprise a stage on which the first and second substrates interposing the sealing material in between are mounted.

Other aspect of the invention provides a method of manufacturing a display device having first and second substrates and a sealing material. The method comprises: irradiating light on the mask; regulating the energy profile of the light irradiated across the sealing material interposed between the first and second substrates; and bonding the sealing material to the first substrate and the second substrate.

The regulating the energy profile of the light can comprise passing the light through a mask having a transmission portion. The transmission portion can comprise a plurality of regions having pattern with different transmittances.

The transmission portion can comprise a first region at a central portion thereof and a second region on both sides of the first region, and wherein the transmittances of the patterns in the first region and the second region are different. The density of the pattern in the first region can be lower than that of the second region.

The method can further, prior to irradiating, comprise: mounting a first substrate and a second substrate to a stage by disposing the first substrate and the second substrate so as to be opposite to each other, with a sealing material being located between the first substrate and the second substrate; and locating the mask in which a transmission portion is formed at a plurality of portions corresponding to the formed sealing material and a plurality of patterns are formed at the transmission portion.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 6 is a cross-sectional view for explaining the organic light emitting display device of FIG. 5a.

DETAILED DESCRIPTION OF CERTAIN INVENTIVE EMBODIMENTS

Figure 1:
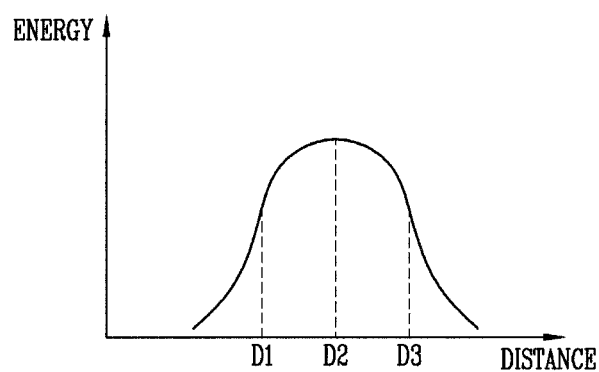
FIG. 1 is a graph showing energy distribution of laser.
Figure 2:
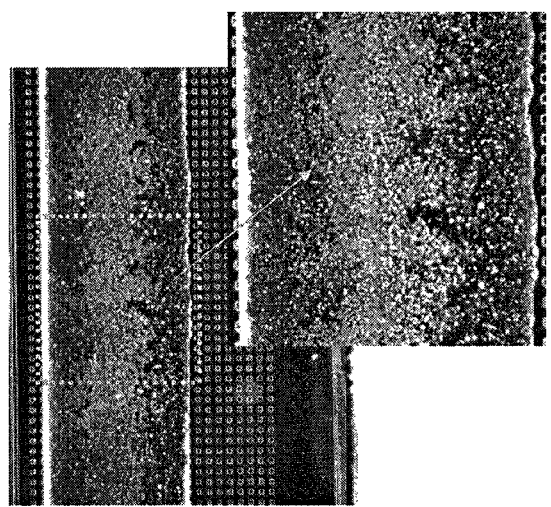
FIG. 2 is an enlarged photograph showing a bonding state of a sealing material and a substrate with an incomplete bonding at side portions.

In the case in which a sealing material is bonded to a substrate by irradiating laser, since the energy of the laser has a Gaussian distribution as shown in FIG. 1, the differences between the energies between a central portion D2 and both side portions D1 and D3 make the bonding state of the sealing material and the substrate inferior. FIG. 2 is an enlarged plan view photographed after laser is irradiated to the sealing material. In FIG. 2, the bonding state of the sealing material and the substrate is represented by the differences of lightness and shading. More particularly, a central portion in which the sealing material and the substrate are properly bonded by sufficient energy is bright, and both side portions in which the sealing material and the substrate are incompletely bonded by relatively low energy are dark. Further, even at a corner portion on which a sealing material is coated in a curved way, since laser is irradiated less at an inner side portion than at an outer side portion due to the difference of the moving speeds of laser, the bonding state of the outer side portion is inferior. Therefore, if an impact is applied to a portion in which the interface bonding state of the sealing material and the substrate, the sealing material is easily separated, thereby harming the sealing state.

Hereinafter, embodiments according to the present invention will be described with reference to the accompanying drawings. The embodiments are provided to allow those skilled in the art to sufficiently understand the present invention and can be varied in various forms. Further, the scope of the present invention is not limited to the embodiments.

Figure 3:
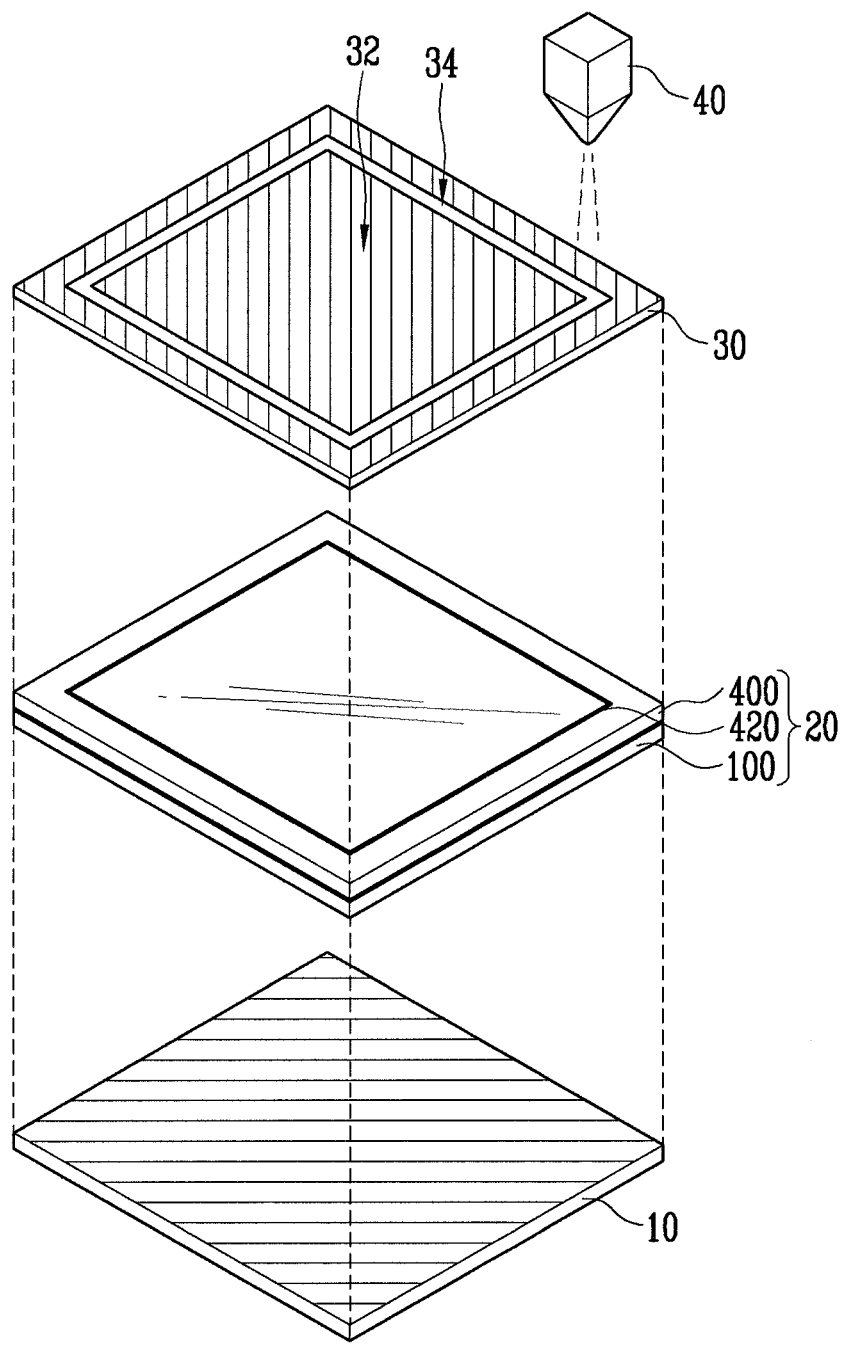
FIG. 3 is an exploded perspective view for explaining a sealing device according to the present invention.

FIG. 3 is an exploded perspective view for explaining a sealing device according to an embodiment of the present invention. The sealing device includes a stage 10 to which a display panel 20 is mounted, a mask 30 disposed on one side of the stage 10, in which a transmission portion 34 is formed at a portion corresponding to a sealing material 420, and an optical head 40 irradiating light to the sealing material 420 along the transmission portion 34. The optical head 40 can be moved by a drive means along the transmission portion 34 and irradiates the light such as laser provided from a light source through a lens so as to have a predetermined width.

A display panel 20 can include a support substrate 100 in which an organic light emitting device is formed, an encapsulation substrate 400 disposed opposite to the support substrate 100, a support substrate 100 for sealing the organic light emitting device, and a sealing material 420 interposed between the support substrate 100 and the encapsulation substrate 400.

The mask 30 includes an organic substrate or a transparent substrate such as quartz and a pattern formed of chrome, etc. on the transparent substrate. The transmission portion 34 is formed at a portion corresponding to the sealing material 420 of the display panel 20 by a chrome pattern 32. In other words, the chrome pattern 32 is formed at a portion corresponding to the organic light emitting device to interrupt the light and the light can be transmitted through the transmission portion 34 in which the chrome pattern 32 is not formed.

In addition, as shown in FIGS. 4a to 4d, patterns 36a to 36g for regulating the amount of the transmitted light are formed in the transmission portion 34 of the mask 30.

Figure 4A:
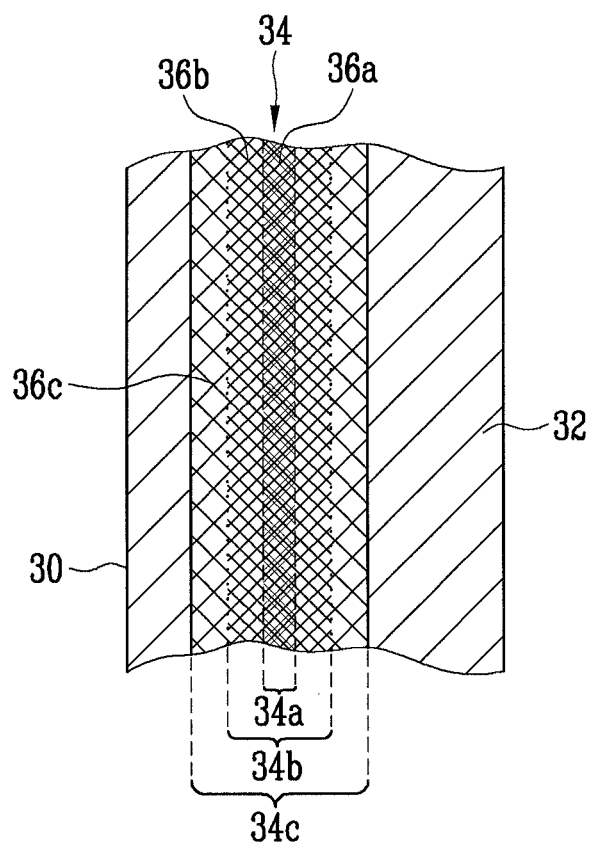
FIGS. 4a and 4b are plan views for explaining a mask according to the first embodiment of the present invention.
Figure 4B:
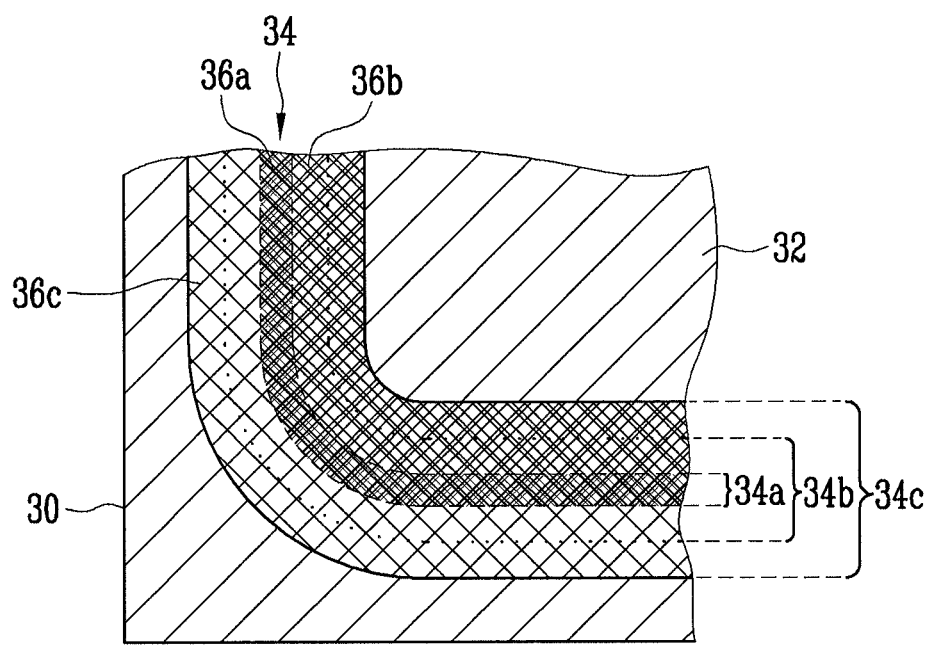

According to the first embodiment of the present invention, the transmission portion 34 includes a plurality of regions in which the densities of the formed patterns are different. For example, the transmission portion 34 is divided into a first region 34a at a central portion, a second region 34b including the first region 34a and wider than the first region 34a, and a third region 34c including the second region 34b and wider than the second region 34b. Line-shaped patterns 36a to 36c crossing each other can be formed in the first to third regions 34a to 34c, respectively. Then, as shown in FIG. 4a, in a portion in which the transmission portion 34 is linearly formed, the densities of the patterns become higher as they go in the order of the first region 34a, the second region 34b, and the third region 34c by the arrangement of the patterns 36a to 36c. Further, as shown in FIG. 4b, in a curved corner portion of the transmission portion, the densities of the patterns of the second and/or third regions 34b and/or 34c on the inner side are higher than the densities of the patterns of the second and/or third regions 34b and/or 34c on the outer side, with reference to the first region 34a of the central portion. If the densities of the patterns 36a to 36c of the first to third regions 34a to 34c are regulated, the amounts of light transmitted to the first to third regions 34a to 34c can be regulated, respectively.

Figure 4C:
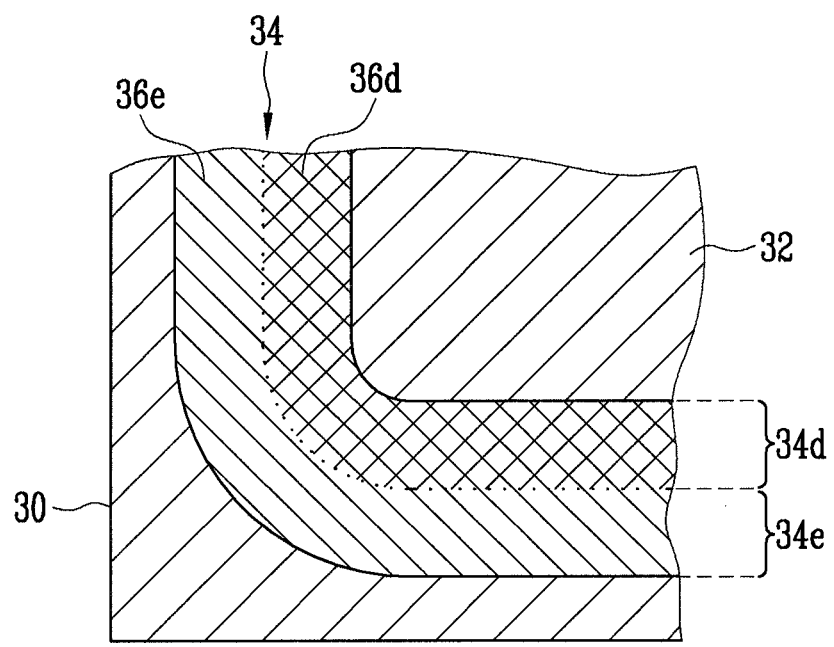
FIG. 4c is a plan view for explaining a mask according to the second embodiment of the present invention.

According to the second embodiment of the present invention, as shown in FIG. 4c, the transmission portion 34 is divided into a first region 34d on the inner side and a second region 34e on the outer side. The densities of the patterns 36d and 36e of the first region 34d and the second region 34e can be formed differently. For example, the line-shaped patterns can be formed in the first region 34d and the second region 34e, respectively. Then, if the densities of the patterns 36d and 36e of the first region 34d are set to be higher than the second region 34e by crossing the patterns 36d and 36e in the first region 34d, the amount of light transmitted t the first region 34d becomes smaller than the amount of light transmitted to the second region 34e.

Figure 4D:
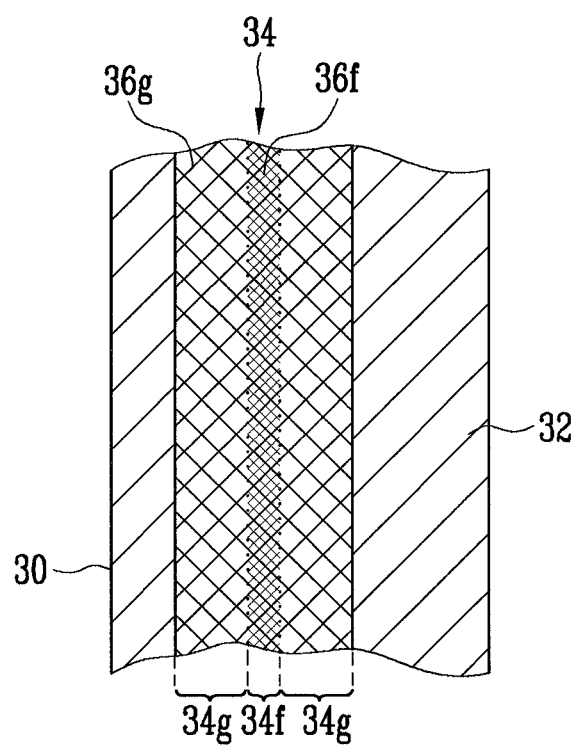
FIG. 4d is a plan view for explaining a mask according to the third embodiment of the present invention.

According to the third embodiment, as shown in FIG. 4d, the transmission portion 34 is divided into a first region 34f at a central portion and a second region 34g on both sides of the first region 34f. The densities of the patterns 36f and 36g of the first region 34f and the second region 34g can be formed differently. For example, line-shaped patterns 36f and 36g can be formed in the first region 34f and the second region 34g, respectively. Then, if the densities of the patterns 36f and 36g of the first region 34f are set to be higher than the second region 34g by crossing the patterns 36f and 36g in the first region 34f, the amount of light transmitted to the first region 34f becomes smaller than the amount of light transmitted to the second region 34g.

In the embodiments, the shape, the density, the line width, and the interval of the patterns 36a to 36g can be selected according to the kind, the energy, and the irradiation mount. In addition, in the embodiments, although the case in which the patterns 36a to 36g are formed in the entire regions of the transmission portion 34 has been explained, they can be selectively formed in some regions of the transmission portion 34. For example, a pattern may not be formed in a peripheral region in which the laser energy is low and can be formed a central portion in which the laser energy is high.

Hereinafter, a method of manufacturing an organic light emitting device using the sealing device according to the present invention will be described with reference to FIGS. 5a to 5e.

Figure 5A:
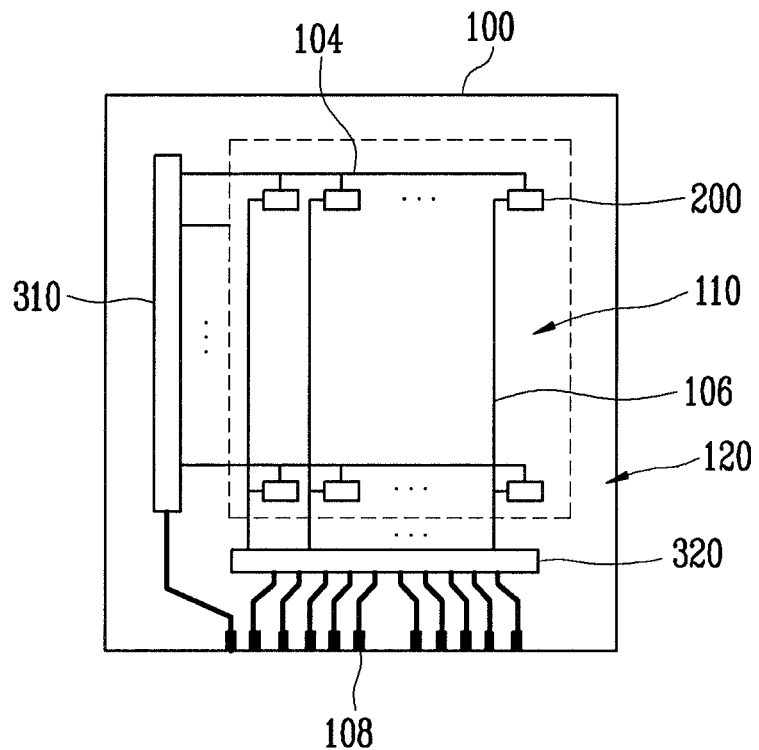
FIGS. 5a, 5b, and 5d are plan views for explaining a method of manufacturing an organic light emitting display device using a sealing device according to the present invention.

Referring to FIG. 5a, a substrate 100 defining a pixel region 110 and a non-pixel region 120 is prepared. A plurality of organic light emitting devices 200 connected between a scan line 104 and a data line in the form of matrix are formed in the substrate 100 of the pixel region 110. A scan line 104 and a data line 106 extending from the scan line 104 and the data line 106 in the pixel region 110, a power source supply line (not shown) for the operation of the organic light emitting devices 200, and a scan drive section 310 and a data drive section 320 processing a signal provided from outside through a pad 108 and supplying the signal to the scan line 104 and the data line 106 are formed in the substrate 100 of the non-pixel region 120.

Figure 6:
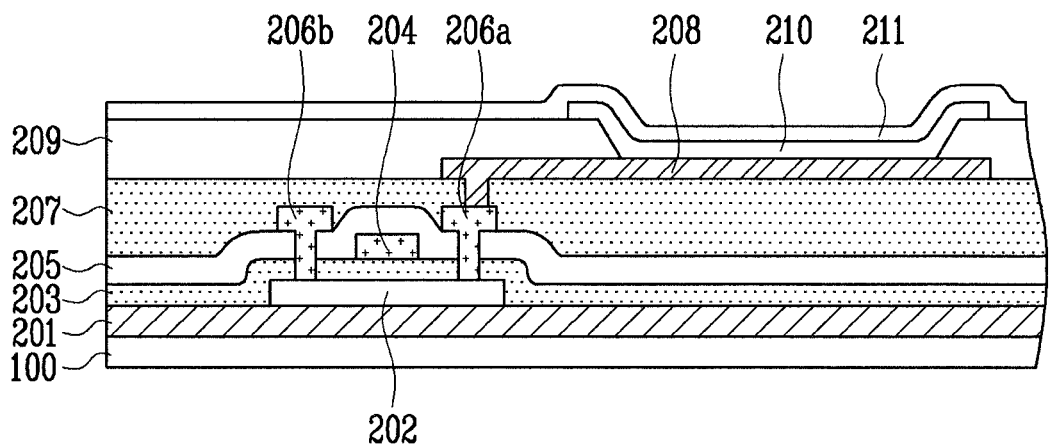

Referring to FIG. 6, the organic light emitting display 200 according to an embodiment of the present invention includes an anode electrode 208 and a cathode electrode 211, and an organic thin film layer 210 formed between the anode electrode 208 and the cathode electrode 211. The organic thin film layer 210 has a structure in which a hole transportation layer, an organic light emitting layer, and an electron transportation layer are stacked and can further include a hole implantation layer and an electron implantation layer. Further, the organic thin film layer can further include a capacitor for maintaining a switching transistor and a signal for controlling the operation of the organic light emitting device 200.

Hereinafter, the manufacturing process of the organic light emitting device 200 will be described in more detail with reference to FIG. 6.

First, a buffer layer 201 is formed on the substrate 100 of the pixel region 110 and the non-pixel region 120. The buffer 201 prevents damage to the substrate 100 due to heat and diffusion of ions from the substrate 100 to the outside, and is formed of an insulation layer such as a silicon dioxide layer ($SiO_2$) or a silicon nitride layer (SiNx).

After a semiconductor layer 202 provided a source/drain region and a channel region is formed on the buffer layer 201 of the pixel region 110, a gate insulation layer 203 is formed on the upper surface of the pixel region 110 including the semiconductor layer 202.

A gate electrode 204 is formed on the gate insulation layer 203 at an upper portion of the semiconductor layer 202. Then, the scan line 104 connected to the gate electrode 204 is formed in the pixel region 110, and a scan line 104 extending from the scan line 104 of the pixel region 110 and a pad 108 for receiving a signal from outside are formed in the non-pixel region 120. The gate electrode 204, the scan line 104, and the pad 108 can be formed of a metal such as molybdenum (Mo), tungsten (W), titanium (Ti), and aluminum (Al) or an alloy of the metals, or by stacking the metals.

An interlayer insulation layer 205 is formed on the entire upper surface of the pixel region 110 including the gate electrode 204. A contact hole is formed by patterning the interlayer insulation layer 205 and the gate insulation layer 203 so that the source and drain regions of the semiconductor layer 202 can be exposed and source and drain electrodes 206a and 206b are formed through the contact hole so as to source and drain regions. Then, a data line 106 connected to the source and drain electrodes 206a and 206b is formed in the pixel region 110 and the data line 106 extending from the data line 106 of the pixel region and the pad for providing a signal from outside are formed in the non-pixel region. The source and drain electrodes 206a and 206b, the data line 106, and the pad 108 can be formed of a metal such as molybdenum (Mo), tungsten (W), titanium (Ti), and aluminum (Al) or an alloy of the metals, or by stacking the metals.

A planarization layer is formed on the entire upper surface of the pixel region and the surface is planarized. A via hole is formed by patterning the planarization layer 207 so that a predetermined portion of the source or drain electrode 206a or 206b and the anode electrode connected to the source or drain electrode 206 or 206b is formed through the via hole.

After a pixel defining layer 209 is formed on the planarization layer 207 so that a portion of the anode electrode 208 can be exposed, an organic thin film layer 210 is formed on the exposed anode electrode 208 and a cathode electrode 211 is formed on the entire upper surface including the organic thin film layer 210.

Figure 5B:
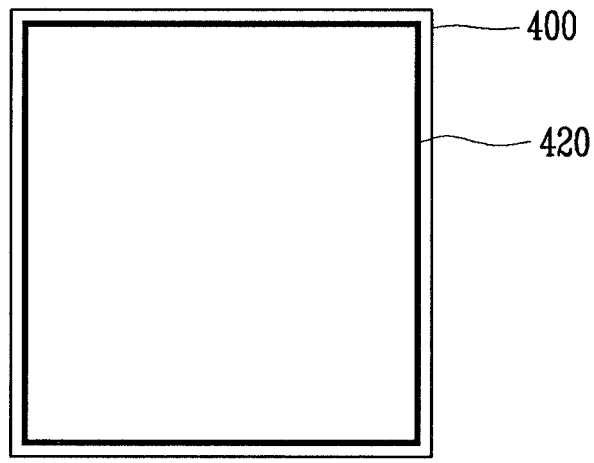
Figure 5C:
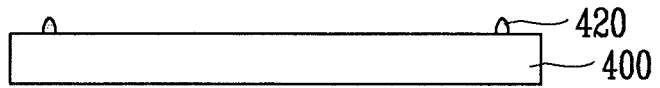
FIGS. 5c and 5e are cross-sectional views for explaining a method of manufacturing an organic light emitting display device using a sealing device according to the present invention.

Referring to FIGS. 5b and 5c, an encapsulation substrate 400 for encapsulating the pixel region 110 is prepared and a sealing material 420 is formed along the peripheral portion of the encapsulation substrate 400. The encapsulation substrate 400 can use a substrate formed of a transparent material such as glass and the sealing material 420 can use a frit including an organic binder and a filler for reducing the thermal expansion coefficient. For example, a paste frit can be coated along a peripheral portion of the encapsulation substrate 400 and be plasticized to remove moisture and the organic binder.

Figure 5D:
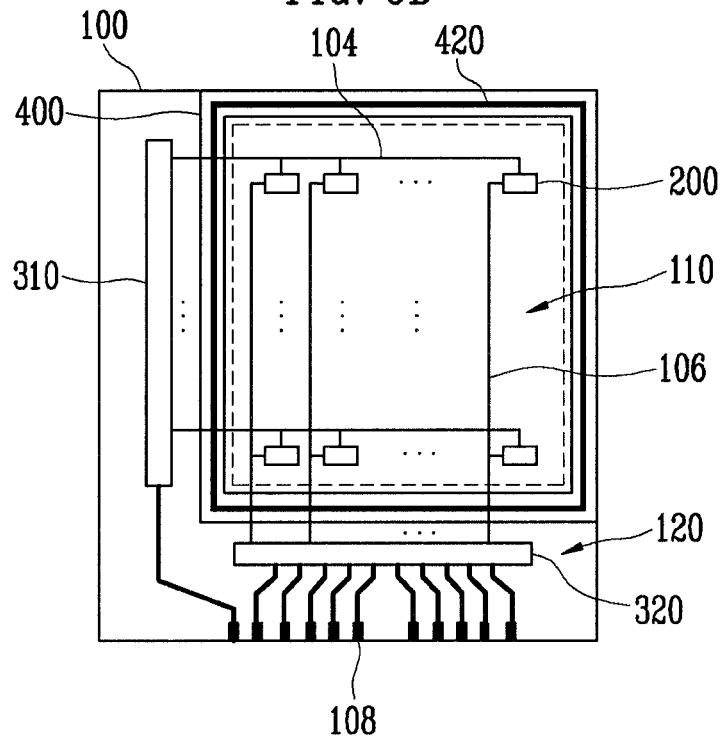
Figure 5E:
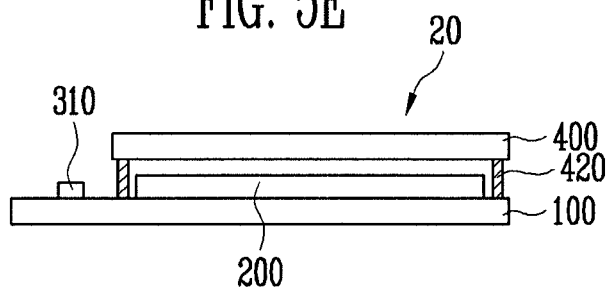

As shown in FIGS. 5*d* and 5*e*, after the encapsulation substrate 400 is disposed at an upper portion of the substrate 100 opposite to the substrate 100, the organic light emitting device 200 is sealed by the sealing material 320.

The substrate 100 and the encapsulation substrate 400 disposed opposite to each other, with the sealing material 320 being interposed therebetween, are mounted to the stage of the sealing device and the mask is located at an upper thereof. The mask 30 is mounted at the position at which the sealing material 420 is formed so that the transmission portion 34 can correspond to the sealing material 320.

Next, if laser is irradiated to the sealing material 420 through the transmission portion 34 while the optical head 40 is moving along the transmission portion 34 of the mask 30, the sealing material 420 is melted by the laser energy so that the substrate 100 can be bonded to the encapsulation substrate 400, thereby uniformizing the amount of the irradiated laser by the patterns 36*a* to 36*g* formed in the transmission portion 34 of the mask 30.

In other words, since the amount of the laser irradiated to the sealing material at the portion corresponding to a laser central portion D2 having high energy is reduced much by the patterns 36*a* to 36*c* formed in the first region 34*a* of the transmission portion 34, while the amount of the laser irradiated to the sealing material 420 at the portions corresponding to the laser both side portions D1 and D3 having relatively low energy is decreased by the patterns 36*b* and 36*c* formed in the second and third regions 34*b* and 34*c*, the sealing material 420 and the substrate 100 can be uniformly bonded to each other on the whole.

In addition, at curved corner portions of the sealing material 420, since the densities of the patterns 36*a* to 36*c* formed in the first region 34*d* having a fast laser moving speed and the second and third regions 34*b* and 34*c* on the inner side of the first region 34*d* are higher than the densities of the patterns 36*b* and 36*c* formed in the second and third regions 34*b* and 34*c* on the outer side of the first region 34*d*, the amount of the irradiated laser is decreased much, thereby uniformizing the interface bonding. (Refer to FIG. 4*b*)

Similarly, even in the case of the embodiments of FIGS. 4*c* and 4*d*, the amount of the irradiated laser is uniformized on the whole according to the densities of the patterns 36*d* to 36*g*, thereby uniformizing the bonding on the whole.

On the other hand, although the cases in which the sealing material 420 seals the pixel region 110 have been described in the embodiments, the present invention is not limited thereto and the sealing material can include the scan drive section 310. In this case, the size of the encapsulation substrate 400 also should be changed. Further, although the cases in which the sealing material 420 is formed in the encapsulation substrate 400 have been described, the present invention is not limited thereto and the sealing material 420 can be formed in the substrate 100. Furthermore, although the laser is used to bond the sealing material to the substrate 100, another light source such as infrared ray can be used.

As mentioned above, the present invention forms patterns for regulating the amount of light irradiated to a transmission portion of a mask. A sealing material and a substrate can be uniformly bonded to each other with uniform energy distribution by selectively decreasing the amount of irradiated light at a portion having high energy and a portion having a slow movement speed. Therefore, the bonding force of the sealing material and the substrate can be reinforced so that penetration of hydrogen, oxygen, or moisture can be perfectly prevented, thereby improving the sealing effect and the reliability and effectively preventing damage to a display device due to an impact.

As mentioned above, certain inventive embodiments have been disclosed through the detailed description and the accompanying drawings. The terms have been used not to restrict the scope of the present invention described in the claims but just to explain the present invention. Accordingly, those skilled in the art can understand that various modifications and other embodiments equivalent to the embodiments of the present invention are possible. Therefore, the true technical protection scope of the present invention should be determined by the technical sprit of the accompanying claims.

What is claimed is:

1. A method of manufacturing a display device having first and second substrates and a sealing material, the method comprising:
   providing a mask comprising a transmission portion;
   irradiating light on the mask;
   regulating the energy profile of the light irradiated across the sealing material interposed between the first and second substrates; and
   bonding the sealing material to the first substrate and the second substrate,
   wherein the transmission portion comprises a first region with a predetermined constant transmittance at a central portion, a second region with a single predetermined transmittance constant throughout the second region provided on both sides of the first region, and a third region with a single predetermined transmittance constant throughout the third region provided on both outer sides of the second region, and wherein the transmittances of patterns of the first region, the second region, and the third region are different from each other;
   wherein the first region, each part of the second region on either side of the first region and each part of the third region on either side of the second region are substantially the same size; and
   wherein the first, second, and third regions each comprise different line-shaped patterns comprising a plurality of opaque lines, and wherein the transmittance is controlled by the density of the opaque lines of the patterns.

2. The method of claim 1, wherein regulating the energy profile of the light comprises passing the light through the transmission portion.

3. The method of claim 1, wherein the patterns are aligned with at least a part of the sealing material.

4. The method of claim 1, wherein energy distribution of the light across the sealing material is controlled by the patterns.

5. The method of claim 1, wherein the light comprises at least one of laser and infrared ray.

6. The method of claim 1, wherein the display device comprises an organic light emitting display device.

7. The method of claim 1, further comprising:
   mounting the first and second substrates to a stage by disposing the first substrate and the second substrate so as to be opposite to each other, with the sealing material being located between the first substrate and the second substrate; and locating the mask in which a transmission portion is formed at a plurality of portions corresponding to the formed sealing material.

\* \* \* \* \*